United States Patent
Ningaraju et al.

(10) Patent No.: US 11,342,439 B2
(45) Date of Patent: May 24, 2022

(54) III-V FIELD EFFECT TRANSISTOR AND SEMICONDUCTOR STRUCTURE

(71) Applicant: Nuvoton Technology Corporation, Hsinchu Science Park (TW)

(72) Inventors: Vivek Ningaraju, mysore (IN); Po-An Chen, Toufen (TW)

(73) Assignee: NUVOTON TECHNOLOGY CORPORATION, Hsinchu (TW)

(*) Notice: Subject to any disclaimer, the term of this patent is extended or adjusted under 35 U.S.C. 154(b) by 30 days.

(21) Appl. No.: 16/228,188

(22) Filed: Dec. 20, 2018

(65) Prior Publication Data
US 2019/0189773 A1    Jun. 20, 2019

(30) Foreign Application Priority Data
Dec. 20, 2017 (TW) .................. 106144828

(51) Int. Cl.
*H01L 29/66* (2006.01)
*H01L 29/10* (2006.01)
(Continued)

(52) U.S. Cl.
CPC .... *H01L 29/66462* (2013.01); *H01L 21/8252* (2013.01); *H01L 21/823857* (2013.01);
(Continued)

(58) Field of Classification Search
CPC ............. H01L 29/66462; H01L 29/861; H01L 29/432; H01L 29/7781; H01L 29/1066;
(Continued)

(56) References Cited

U.S. PATENT DOCUMENTS

| | | |
|---|---|---|
| 7,728,356 B2 | 6/2010 | Suh et al. |
| 2013/0234153 A1 | 9/2013 | Lidow et al. |

(Continued)

FOREIGN PATENT DOCUMENTS

| | | |
|---|---|---|
| TW | 200605079 A | 2/2006 |
| TW | 200802815 A | 1/2008 |
| TW | 200943531 A | 10/2009 |

OTHER PUBLICATIONS

Han et al. AlGaN/GaN Metal-Oxide-Semiconductor Heterojunction Field-Effect Transistor Integrated with Clamp Circuit to Enable Normally-Off Operation. IEEE Electron Device Letters. Jun. 2015. pp. 540-542. 36-6.

(Continued)

*Primary Examiner* — Nduka E Ojeh
*Assistant Examiner* — Gardner W. S. Swan
(74) *Attorney, Agent, or Firm* — Muncy, Geissler, Olds & Lowe, P.C.

(57) ABSTRACT

A semiconductor device and a semiconductor structure are disclosed. The semiconductor device includes a substrate, a first III-V compound layer, a second III-V compound layer, a source, a drain and a gate stack structure. The first III-V compound layer is disposed on the substrate. The second III-V compound layer is disposed on the first III-V compound layer. The source and the drain are disposed on opposite sidewall boundaries of the second III-V compound layer. The gate stack structure is disposed on the second III-V compound layer. The gate stack structure includes a first gate and a second gate. The first gate is disposed on the second III-V compound layer. The second gate is disposed on and electrically isolated from the first gate. The second gate is electrically coupled to the source.

15 Claims, 4 Drawing Sheets

(51) Int. Cl.
*H01L 29/778* (2006.01)
*H01L 29/43* (2006.01)
*H01L 27/092* (2006.01)
*H01L 29/861* (2006.01)
*H01L 21/8238* (2006.01)
*H01L 21/8252* (2006.01)
*H01L 27/098* (2006.01)
*H01L 29/20* (2006.01)
*H01L 29/788* (2006.01)
*H01L 29/808* (2006.01)

(52) U.S. Cl.
CPC ........ *H01L 27/098* (2013.01); *H01L 27/0922* (2013.01); *H01L 29/1066* (2013.01); *H01L 29/432* (2013.01); *H01L 29/7781* (2013.01); *H01L 29/861* (2013.01); *H01L 29/2003* (2013.01); *H01L 29/7786* (2013.01); *H01L 29/788* (2013.01); *H01L 29/808* (2013.01)

(58) Field of Classification Search
CPC ............... H01L 27/098; H01L 27/0922; H01L 21/8252; H01L 21/823857; H01L 29/2003
USPC ........................................................ 257/194
See application file for complete search history.

(56) References Cited

U.S. PATENT DOCUMENTS

2013/0320349 A1* 12/2013 Saunier ............. H01L 29/66462 257/76
2015/0214352 A1* 7/2015 Strassburg .......... H01L 29/7787 257/77
2016/0225864 A1* 8/2016 Strassburg ........ H01L 29/42332
2017/0148912 A1* 5/2017 Chu .................. H01L 29/66666
2019/0067465 A1* 2/2019 Sizov ................ H01L 29/42356

OTHER PUBLICATIONS

Jauss et al. Poly-Silicon CMOS compatible Gate Module for AlGaN/GaN-on-Silicon MIS-HEMTs for Power Electronics Applications. Proceedings of the 2016 28th International Symposium on Power Semiconductor Devices and ICs. Jun. 12-16, 2016. Prague, Czechia.

Taiwan Intellectual Property Office, Office Action, dated Jan. 17, 2019, 6 pages.

* cited by examiner

III-V FIELD EFFECT TRANSISTOR AND SEMICONDUCTOR STRUCTURE

CROSS REFERENCE TO RELATED APPLICATIONS

This Application claims priority of Taiwan Patent Application No. 106144828, filed on Dec. 20, 2017, the entirety of which is incorporated by reference herein.

BACKGROUND

Technical Field

The embodiment of the present disclosure relates to semiconductor devices and semiconductor structures, and in particular to an enhancement-mode high electron mobility transistor (E-mode HEMT) device and a semiconductor structure including an E-mode HEMT device.

Description of the Related Art

A high electron mobility transistor (HEMT) is a type of field-effect transistor that uses the junction formed by two materials with different band gaps as carrier channels. Compared to conventional transistors, gallium nitride (GaN) HEMTs have excellent high frequency performance, therefore can be operated at high frequency ranges, such as millimeter wave frequencies, and therefore can be applied, for example, in cell phones, satellite television receivers, voltage converters or radar equipment and other high-frequency electronic products. However, the performance of the present HEMTs needs to be improved further.

Consequently, there is a need in the art for a HEMT to improve the above drawbacks.

BRIEF SUMMARY

An embodiment of the present disclosure provides a semiconductor device. The semiconductor device includes a substrate, a first III-V compound layer, a second III-V compound layer, a source, a drain and a gate stack. The first III-V compound layer is disposed on the substrate. The second III-V compound layer is disposed on the first III-V compound layer. The source and the drain are disposed on opposite side boundaries of the second III-V compound layer. The gate stack structure is disposed on the second III-V compound layer, wherein the gate stack structure includes a first gate and a second gate. The first gate is disposed on the second III-V compound layer. The second gate is disposed on the first gate and electrically insulated from the first gate, wherein the second gate is electrically coupled to the source.

Another embodiment of the present disclosure provides a semiconductor structure. The semiconductor structure includes an inverter, a semiconductor device and a junction field effect transistor. The inverter is disposed on a substrate, wherein the inverter has an input and an output. The semiconductor device includes a substrate, a first III-V compound layer, a second III-V compound layer, a source, a drain and a gate stack. The first III-V compound layer is disposed on the substrate. The second III-V compound layer is disposed on the first III-V compound layer. The source and the drain are disposed on opposite side boundaries of the second III-V compound layer. The gate stack structure disposed on the second III-V compound layer, wherein the gate stack structure includes a first gate and a second gate. The first gate is disposed on the second III-V compound layer. The second gate is disposed on the first gate and electrically insulated from the first gate, wherein the second gate is electrically coupled to the source and the output of the inverter. A gate and a drain of the junction field effect transistor are electrically coupled to the source of the semiconductor device, wherein the source of a junction field effect transistor is coupled to a ground.

DETAILED DESCRIPTION

In order to make the objects, features and advantages of the present invention more obviously understandable, the embodiments are described below in detail with reference to the accompanying drawings. The specification of the present invention provides different embodiments to illustrate the technological features of different embodiments of the present disclosure. Among them, the arrangement of each element in the embodiments is used for illustrative only and is not intended to limit the present invention. Further, parts of symbols in the figures of the embodiments are repeated for the sake of simplicity of explanation and do not indicate the relationship between the different embodiments.

An embodiment of the present disclosure provides a semiconductor device, for example, an enhancement-mode (E-mode) high electron mobility transistor (HEMT). The semiconductor device according to the embodiment of the present disclosure utilizes a gate stack of a flash memory as a gate structure to enhance a threshold voltage of the HEMT as an E-mode transistor.

Figure 1:
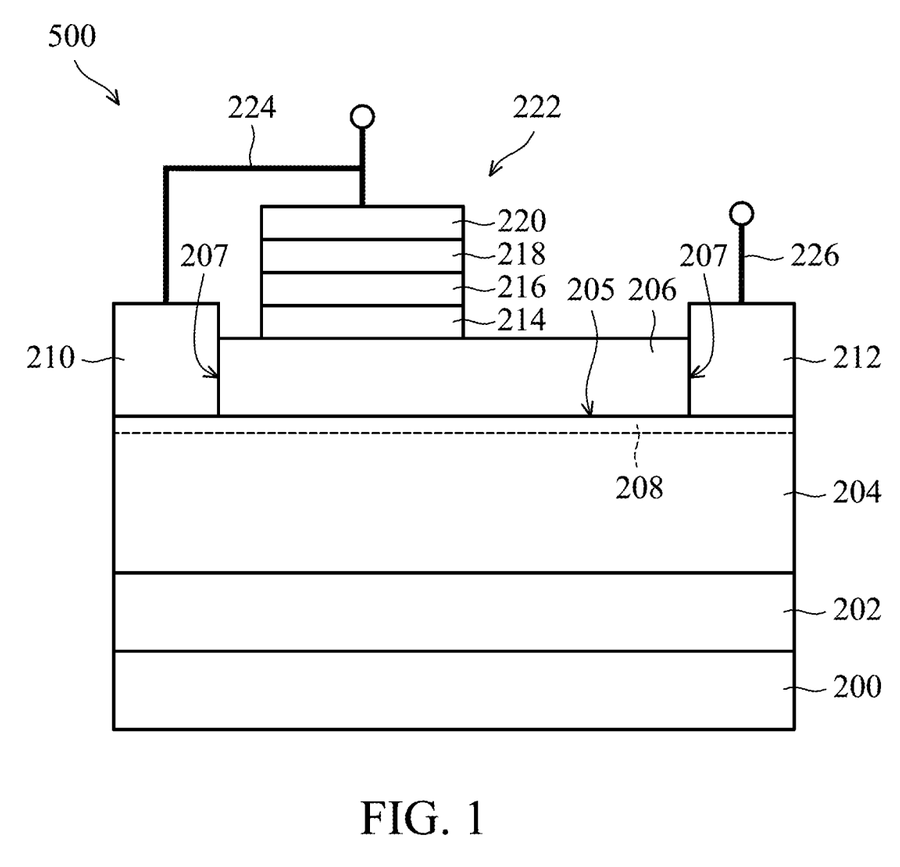
FIG. 1 is a cross-sectional view of a semiconductor device according to some embodiments of the present disclosure.

FIG. 1 is a cross-sectional view of a semiconductor device 500 according to some embodiments of the present disclosure. As illustrated in FIG. 1, in some embodiments of the present disclosure, the semiconductor device 500 is, for example, an enhancement-mode high electron mobility transistor (E-mode HEMT). The semiconductor device 500 includes a substrate 200, a first III-V compound layer 204, a second III-V compound layer 206, a source 210, a drain 212 and a gate stack structure 222.

In some embodiments of the present disclosure, the substrate 200 may be a silicon substrate, which may have a (111) crystallographic orientation. In other embodiments of the present disclosure, the substrate 200 may be made of silicon germanium (SiGe), bulk semiconductor, strained semiconductor, compound semiconductor, or other commonly used semiconductor substrate. In some embodiments of the present disclosure, P-type dopants may be used to dope the substrate 200 so that the doping concentration of the substrate 200 is about $10^{14}$-$10^{17}$/cm$^3$.

As illustrated in FIG. 1, the semiconductor device 500 according to some embodiments of the present disclosure may include a buffer layer 202 disposed over the substrate 200. The buffer layer 202 may be used to reduce defects due to lattice dislocation between the substrate 200 and a III-V compound layer formed later. In some embodiments of the present disclosure, the buffer layer 202 may include a single layer structure formed of, for example, an AlN seed layer, or a multi-layer structure formed of an AlN seed layer and an AlGaN transition layer.

As illustrated in FIG. 1, the first III-V compound layer 204 of the semiconductor device 500 is disposed on the substrate 200, and the second III-V compound layer 206 is disposed on the first III-V compound layer 204. In some embodiments of the present disclosure, the top surface 205 of the first III-V compound layer 204 is in direct contact with the second III-V compound layer 206 and the second III-V compound layer 206 covers a portion of the top surface 205 of the first III-V compound layer 204.

In some embodiments of the present disclosure, the first III-V compound layer 204 and the second III-V compound layer 206 are composed of compounds formed from group III-V elements in the periodic table, although they have different compositions from each other. For example, the first III-V compound layer 204 and the second III-V compound layer 206 include nitride layers with different band gaps. For example, the first III-V compound layer 204 includes a GaN layer and the second III-V compound layer 206 includes an $Al_xGa_{1-x}N$ layer, wherein $0<x\leq 1$. In some embodiments of the present disclosure, the first III-V compound layer 204 may be an undoped III-V compound layer and the second III-V compound layer 206 may be a doped III-V compound layer or an undoped III-V compound layer. In this embodiment, the first III-V compound layer 204 may be an undoped GaN layer and the second III-V compound layer 206 may be an undoped $Al_xGa_{1-x}N$ layer.

Since the first III-V compound layer 204 and the second III-V compound layer 206 have different band gaps, a heterojunction, which is used as the first III-V compound layer 204 of a non-doped relatively narrow bandgap channel layer and used as the second III-V compound layer 206 of a relatively wide bandgap n-type donor supply layer, is formed at the junction (which is the same place as the top surface 205 of the first III-V compound layer 204), and may be used as a channel region of the semiconductor device 500.

In some embodiments of the present disclosure, when the first III-V compound layer 204 is a GaN layer, gallium-containing precursors and nitrogen-containing precursors may be used to grow the first III-V compound layer 204 by epitaxial growth process of metal organic vapor phase epitaxy (MOVPE). For example, the gallium-containing precursors include trimethylgallium (TMG), triethylgallium (TEG), or another suitable chemical. For example, the nitrogen-containing precursors include ammonia ($NH_3$), tertiarybutylamine (TBAm), phenyl hydrazine or other suitable chemicals.

In some embodiments of the present disclosure, when the second III-V compound layer 206 is an $Al_xGa_{1-x}N$ layer, aluminum-containing precursors, gallium-containing precursors, and nitrogen-containing precursors may be used, and the second III-V compound layer 206 is grown by epitaxial growth process of metal organic vapor phase epitaxy (MOVPE). For example, the aluminum-containing precursors include trimethylaluminum (TMA), triethylaluminum (TEA) or other suitable chemicals. For example, the gallium-containing precursors include trimethylgallium (TMG), triethylgallium (TEG), or other suitable chemicals. For example, the nitrogen-containing precursors include ammonia ($NH_3$), tertiarybutylamine (TBAm), phenyl hydrazine or other suitable chemicals.

In some embodiments of the present disclosure, the first III-V compound layer 204 and the second III-V compound layer 206 formed on the substrate 200 and adjacent to each other also form a two-dimensional electron gas (2DEG) thin layer 208 with high mobile conduction electrons along an interface (or at the junction, located at the same position as the top surface 205 of the first III-V compound layer 204) near the first III-V compound layer 204 and the second III-V compound layer 206 due to the polarization direction generated by a band gap discontinuity and the piezo-electric effect. The 2DEG thin layer 208 forms a carrier channel.

In some embodiments of the present disclosure, the 2DEG thin layer 208 is formed when the first III-V compound layer 204 and the second III-V compound layer 206 of the semiconductor device 500 are nitride layers and the gate bias is 0 volt (V). The semiconductor device 500 may be a depletion mode device, which may also be referred to as a normally on device.

As illustrated in FIG. 1, the source 210 and the drain 212 of the semiconductor device 500 are disposed on opposite side boundaries 207 of the second III-V compound layer 206. In addition, the source 210 and the drain 212 respectively contact different portions of the top surface 205 of the first III-V compound layer 204 exposed by the second III-V compound layer 206. In other words, the source 210 contacts a portion of the top surface 205 of the first III-V compound layer and a side boundary 207 of the second III-V compound layer 206 while the drain 212 contacts another portion of the top surface 205 of the first III-V compound layer 204 and another side boundary 207 of the second III-V compound layer 206. In some embodiments of the present disclosure, the source 210 and the drain 212 are electrically connected to the 2DEG thin layer 208.

In some other embodiments of the present disclosure, bottom portions of the source 210 and the drain 212 of the semiconductor device 500 may be aligned with a bottom portion of the 2DEG thin layer 208 (i.e., the dotted line of the 2DEG thin layer 208). Alternatively, the bottom portions of the source 210 and the drain 212 of the semiconductor device 500 may be aligned with a top portion of the second III-V compound layer 206 while opposite side boundaries of the second III-V compound layer 206 are coupled to the first III-V compound layer 204.

In some embodiments of the present disclosure, the source 210 and the drain 212 include one or more conductive materials. For example, the source 210 and the drain 212 include metals selected from a group composed of titanium, aluminum, nickel, and gold. The source 210 and the drain 212 may be formed by utilizing physical vapor deposition (PVD), chemical vapor deposition (CVD), atomic layer deposition (ALD), coating, sputtering, or other suitable technique.

As illustrated in FIG. 1, the gate stack structure 222 of the semiconductor device 500 is disposed on the top surface of the second III-V compound layer 206, between the source 210 and the drain 212, and apart from the source 210 and drain 212. In some embodiments of the present disclosure, the gate stack structure 222 includes a first gate dielectric layer 214, a first gate 216, a second gate dielectric layer 218 and a second gate 220 stacked sequentially from the bottom up. The first gate 216 is disposed on the second III-V compound layer 206, the second gate 220 is disposed over the first gate 216 and electrically insulated from the first gate 216, the first gate dielectric layer 214 is disposed between the first gate 216 and the second III-V compound layer 206 and contacts the first gate 216 and the second III-V compound layer 206, and the second gate dielectric layer 218 is disposed between the first gate 216 and the second gate 220 and contacts the first gate 216 and the second gate 220.

Moreover, the second gate 220 may be electrically coupled to the source 210 through a wire 224, and the drain 212 may be electrically coupled to a drain operating voltage (Vd) (not shown) through a wire 226.

In some embodiments of the present disclosure, the first gate 216 and the second gate 220 may be the same or different materials. For example, the first gate 216 and the second gate 220 may include one or more layers of conductor material, for example, polysilicon, aluminum, copper, titanium, tantalum, tungsten, cobalt, molybdenum, tantalum nitride, nickel silicide, cobalt silicide, titanium nitride, tungsten nitride, TiAl, TiAlN, TaCN, TaC, TaSiN, metal alloy, or other suitable material. In this embodiment, the first gate 216 and the second gate 220 may be polysilicon.

In some embodiments of the present disclosure, the first gate dielectric layer 214 and the second gate dielectric layer 218 may be the same or different materials. For example, the first gate dielectric layer 214 and the second gate dielectric layer 218 may include one or more layers of dielectric material, for example, silicon oxide, silicon nitride, high-κ dielectric material, or other suitable dielectric material. The high-κ dielectric material may include, for example, hafnium oxide ($HfO_2$), hafnium silicate (HfSiO), hafnium silicon oxynitride (HfSiON), hafnium tantalum oxide (HMO), hafnium titanate (HMO), hafnium zirconium oxide (HfZrO), zirconium oxide (ZrO), aluminum oxide ($Al_2O_3$), titanium oxide, hafnium oxide-aluminum oxide ($HfO_2$—$Al_2O_3$) alloy, combinations thereof, or other suitable high-κ dielectric material. In this embodiment, the first gate dielectric layer 214 and the second gate dielectric layer 218 may be aluminum oxide ($Al_2O_3$).

In some embodiments of the present disclosure, the gate stack structure 222 of the semiconductor device 500 may be similar to the gate stack structure of a flash memory device. As illustrated in FIG. 1, the first gate 216 of the gate stack structure 222 may be electrically insulated from the second III-V compound layer 206 by the first gate dielectric layer 214, and the second gate dielectric layer 218 is electrically insulated from the second gate 220. Therefore, the first gate 216 is electrically floating and may be regarded as a floating gate (FG). Further, the second gate 220, located directly above the first gate 216 and separated from the first gate 216 by the second gate dielectric layer 218, may be regarded as a control gate (CG). Furthermore, the first gate dielectric layer 214 may be regarded as a tunnel oxide layer and the second gate dielectric layer 218 may be regarded as a blocking oxide. Therefore, the voltage applied to the first gate 216 may be substantially determined by the capacitor coupling ratio between the first gate 216 and the second gate 220.

In some embodiments of the present disclosure, the semiconductor device 500 may form an enhancement-mode (E-mode) transistor, such as an enhancement-mode high electron mobility transistor (E-mode HEMT), by electrically coupling the second gate (control gate) 220 of the gate stack structure 222 to the source 210. The following equation is used to illustrate that the voltage (VG) applied to the gate stack structure 222 and the voltage (VS) of the source 210 have to satisfy equation (1) when the semiconductor device 500 according to the embodiment of the present disclosure is turned on:

$$V_{FG}-V_S \geq Vt \qquad \text{equation (1),}$$

wherein $V_{FG}$ is the voltage applied to the first gate (floating gate) 216 of the gate stack structure 222, $V_S$ is the voltage applied to the source 210, and Vt is the threshold voltage of the semiconductor device 500.

In addition, the voltage ($V_{FG}$) applied to the second gate 220 of the gate stack structure 222 depends on the coupling ratio, as shown in equation (2):

$$V_{FG}=\alpha_{CG}V_{CG}+\alpha_D V_D+\alpha_S V_S+\alpha_B V_B \qquad \text{equation (2),}$$

wherein $\alpha_{CG}$, $\alpha_D$, $\alpha_S$ and $\alpha_B$ are respectively the CG coupling ratio, the drain coupling ratio, the source coupling ratio and the bulk coupling ratio, respectively. $V_{FG}$, $V_{CG}$, $V_D$, $V_S$, and $V_B$ are voltages applied to the first gate (floating gate) 216, the second gate (control gate) 220, the drain 212, the source 210, and the substrate 200, respectively.

In some embodiments of the present disclosure, assuming that the values of the drain coupling ratio ($\alpha_D$) and the source coupling ratio ($\alpha_S$) are 0, and the voltage ($V_B$) applied to the substrate 200 is 0 volt (V), then the voltage ($V_{FG}$) applied to the first gate 216 of the gate stack structure 222 depends on the voltage ($V_{CG}$) applied to the second gate 220 of the gate stack structure 222 and the CG coupling ratio ($\alpha_{CG}$), which means that equation (2) would be similar to $V_{FG}=\alpha_{CG}V_{CG}$. Further, substituting the condition ($V_{CG}=V_S$) that the second gate (control gate) 220 is electrically coupled to the source 210 into equation (1) would obtain equation (3):

$$(\alpha_{CG}-1)V_{CG} \geq Vt \qquad \text{equation (3)}$$

In some embodiments of the present disclosure, assuming that the CG coupling ratio ($\alpha_{CG}$) of the semiconductor device 500 is 10% and the threshold voltage (Vt) of the semiconductor device 500 is −4 V, and substituting them into equation (3) would obtain: $-0.9 \times V_{CG} \geq -4$. Therefore, it should be understood that $V_{CG} \leq 4.4$ V when the semiconductor device 500 according to the embodiment of the present disclosure is turned on.

According to the aforementioned conditions, assuming that the voltage applied to the second gate (control gate) 220 ($V_{CG}$) is 5 V, the voltage ($V_{FG}$) applied to the first gate (floating gate) 216 is 0.5 V, and the voltage ($V_S$) applied to the source 210 is also 5 V, then the difference ($V_{FG}-V_S$) between the voltage applied to the first gate (floating gate) 216 and the voltage applied to the source 210 will be smaller than the threshold voltage (Vt) of the semiconductor device 500 ($V_{FG}-V_S=-4.5$ (V)$\leq -4$ (V)). At this time, the semiconductor device 500 is in a turned-off state. Therefore, the coupling ratio (e.g., the CG coupling ratio ($\alpha_{CG}$)) of the gate stack structure 222 of the semiconductor device 500 may be fine-tuned, and the second gate (control gate) 220 may be electrically coupled to the source 210, so that the semiconductor device 500 becomes an E-mode transistor. The E-mode transistor will be turned on when an appropriate bias is generated by the voltage applied to the gate stack, and the semiconductor device 500 in this configuration may be also regarded as enhancement-mode high electron mobility transistor (E-mode HEMT).

Figure 2A:
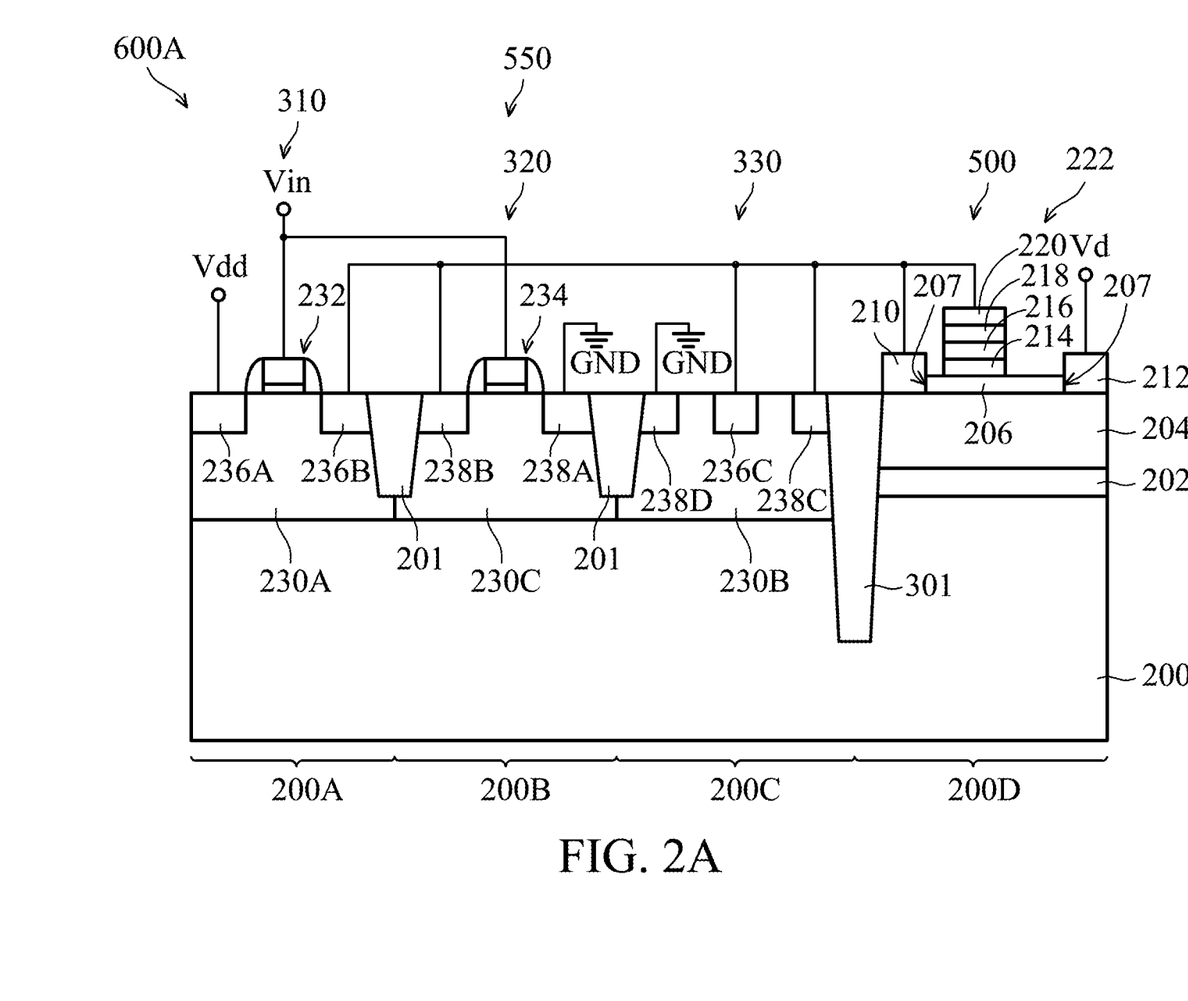
FIG. 2A is a cross-sectional view of a semiconductor device according to some embodiments of the present disclosure.
Figure 2B:
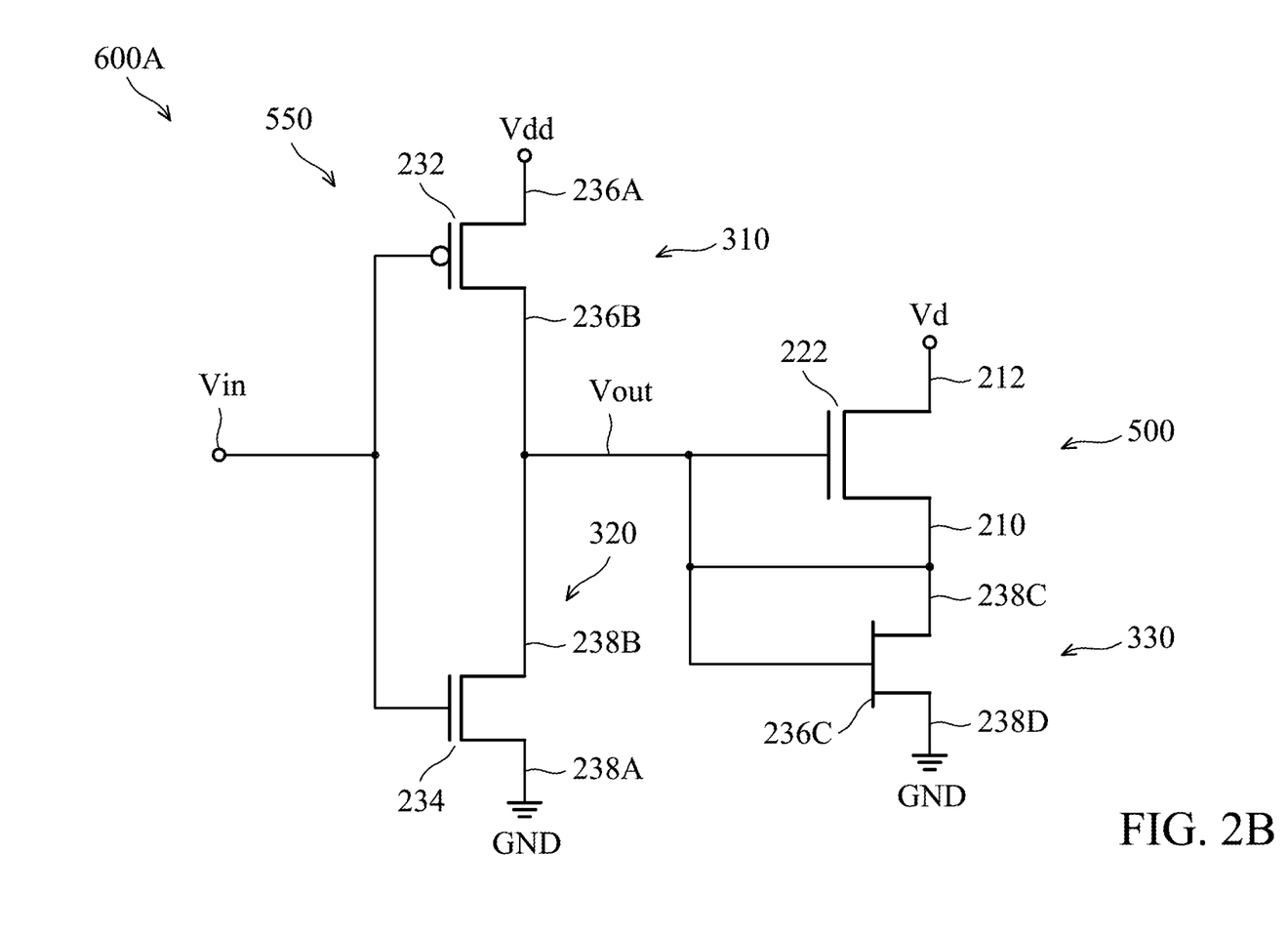
FIG. 2B shows an equivalent circuit diagram of FIG. 2A.

FIG. 2A shows a cross-sectional view of a semiconductor structure 600A according to some embodiments of the present disclosure, which includes the semiconductor device 500 of FIG. 1. FIG. 2B shows an equivalent circuit diagram of FIG. 2A. In some embodiments of the present disclosure, the semiconductor structure 600A includes an inverter 550, a semiconductor device 500 (the structure of which is the same as illustrated in FIG. 1 and is used as an E-mode transistor) and a junction field effect transistor (JFET) 330 formed on the substrate 200. In addition, the substrate 200 may be a P-type substrate, and may include a plurality of active regions 200A, 200B, 200C and 200D. The active regions 200A, 200B and 200C are separated from each other by a plurality of shallow trench isolations 201, and the active regions 200C and 200D are separated from each other by a deep trench isolation 301. The depth of the deep trench isolation 301 is designed to be greater than the depth of the shallow trench isolation 201 to effectively electrically isolate the semiconductor device 500 from the JFET 330. In some embodiments of the present disclosure, the substrate 200 may be doped by P-type dopants so that the doping concentration of the substrate 200 is about $10^{14}$-$10^{17}$/cm$^3$.

As illustrated in FIGS. 2A and 2B, the inverter 550 of the semiconductor structure 600A may be disposed on the substrate 200 and located in the active regions 200A and 200B of the substrate 200. In addition, the inverter 550 has an input Vin and an output Vout. In some embodiments of the present disclosure, the inverter 550 includes a P-type Metal-Oxide-Semiconductor Field Effect Transistor (MOSFET) 310 and an N-type MOSFET 320. The P-type MOSFET 310 may be formed in an N-type well region 230A in the active area 200A of the substrate 200 and may include a gate 232 and P+ doped regions 236A and 236B. The gate 232 of the P-type MOSFET 310 is located above the substrate 200 in the active area 200A. The P+ doped regions 236A and 236B of the P-type MOSFET 310 are located on the N-type well region 230A and disposed on opposite sides of the gate 232, and the P+ doped regions 236A and 236B may be regarded as the source 236A and the drain 236B of the P-type MOSFET 310, respectively. In some embodiments of the present disclosure, the doping concentration of the N-type well region 230A may be about $10^{16}$-$10^{19}$/cm$^3$ and the doping concentration of the P+ doped regions 236A and 236B may be about $10^{19}$-$10^{21}$/cm$^3$.

As illustrated in FIGS. 2A and 2B, the N-type MOSFET 320 of the inverter 550 may be formed in a P-type well region 230C in the active region 200B of the substrate 200 and may include a gate 234, N+ doped regions 238A and 238B. The gate 234 of the N-type MOSFET 320 is located above the (P-type) substrate 200 in the active region 200B. The N+ doped regions 238A and 238B of the N-type MOSFET 320 are located on the P-type well region 230C and disposed on two opposite sides of the gate 234, and the N+ doped regions 238A and 238B may be regarded as the source 238A and the drain 238B of N-type MOSFET, respectively. In some embodiments of the present disclosure, the doping concentration of the N+ doped regions 238A and 238B may be about $10^{19}$-$10^{21}$/cm$^3$.

In some embodiments of the present disclosure, the gate 232 of the P-type MOSFET 310 is electrically coupled to the gate 234 of the N-type MOSFET 320, and they are used together as an input Vin of the inverter 550. Moreover, the source (P+ doped region) 236A of the P-type MOSFET 310 is electrically coupled to a power supply driving voltage Vdd. In addition, the drain (P+ doped region) 236B of the P-type MOSFET 310 is electrically coupled to the drain (N+ doped region) 238B of the N-type MOSFET 320 and used as the output Vout of the inverter 550. Further, the source (N+ doped region) 238A of the N-type MOSFET 320 is electrically coupled to the ground GND. The bottom of the substrate 200 in FIGS. 2A and 2B is represented by using the ground symbol and the word GND.

As illustrated in FIGS. 2A and 2B, the semiconductor device 500 (enhancement-mode transistor) of the semiconductor structure 600A is disposed in the active area 200D of the substrate 200. In some embodiments of the present disclosure, a semiconductor device 500, used as an enhancement-mode transistor, includes a first III-V compound layer 204, a second III-V compound layer 206, a gate stack structure 222, a source 210, and a drain 212. The first III-V compound layer 204 is disposed above the substrate 200 and on the buffer layer 202. The second III-V compound layer 206 is disposed on the first III-V compound layer 204. The source 210 and the drain 212 are disposed on opposite side boundaries 207 of the second III-V compound layer 206. The gate stack structure 222 is disposed on the second III-V compound layer 206 and between the source 210 and the drain 212. The gate stack structure 222 includes a first gate dielectric layer 214, a first gate 216, a second gate dielectric layer 218 and a second gate 220 stacked sequentially from bottom up. The first gate 216 is disposed on the second III-V compound layer 206, the second gate 220 is disposed over the first gate 216 and electrically insulated from the first gate 216, the first gate dielectric layer 214 is disposed between the first gate 216 and the second III-V compound layer 206 and contacts the first gate 216 and the second III-V compound layer 206, and the second gate dielectric layer 218 is disposed between the first gate 216 and the second gate 220 and contacts the first gate 216 and the second gate 220.

In some embodiments of the present disclosure, the second gate 220 of the semiconductor device 500 of the semiconductor structure 600A is electrically coupled to the output Vout of the inverter 550 and the source 210. The drain 212 of the semiconductor device 500 is electrically coupled to a drain operation voltage Vd. Further, the semiconductor device 500 is used as an E-mode HEMT.

As illustrated in FIGS. 2A and 2B, the JFET 330 of the semiconductor structure 600A is disposed in the active area 200C of the substrate 200. In some embodiments of the present disclosure, the JFET 330 includes an N-type well region 230B, a P-type doped region 236C and N-type doped regions 238C and 238D. The N-type well region 230B of the JFET 330 is disposed on the substrate 200. The P-type doped region 236C and the N-type doped regions 238C and 238D of the JFET 330 are disposed on the N-type well region 230B. Furthermore, the N-type doped regions 238C and 238D are located on opposite sides of the P-type doped region 236C and are separated from the P-type doped region 236C.

In some embodiments of the present disclosure, the P-type doped region 236C of the JFET 330 is used as the gate of the JFET 330, and the N-type doped regions 238C and 238D are respectively used as the drain and the source of the JFET 330. As illustrated in FIGS. 2A and 2B, the P-type doped region 236C (gate) and the N-type doped region 238C (drain) of the JFET 330 are electrically coupled to the source 210 of the semiconductor device 500. In addition, the N-type doped region 238D (source) of the JFET 330 is electrically coupled to the ground GND and at the bottom of the substrate 200 in FIGS. 2A and 2B, represented by the ground symbol and the word GND.

In some embodiments of the present disclosure, the N-type well region 230A and the N-type well region 230B of the JFET 330 are formed simultaneously and have the same or similar doping concentration. In addition, the P-type doped region 236C (gate) of the JFET 330 may be formed simultaneously with the P+ doped regions 236A and 236B and have the same or similar doping concentration. In addition, the N-type doped regions 238C and 238D (drain and source) may be formed simultaneously with the N+ doped regions 238A and 238B and have the same or similar doping concentration.

The operation of the semiconductor structure 600A will be described below by using FIG. 2B. When the voltage "1" (i.e., the voltage potential of logic 1) is applied to the input Vin of the inverter 550, the output Vout of the inverter 550 outputs the voltage "0" (i.e., the voltage potential of logic 0), the gate 222 and the source 210 of the semiconductor device 500 and the gate 236C of the JFET 330 are all voltage inputs of "0". Therefore, at this time, the semiconductor device 500 is in an on-state, and the JFET 330 is also in an on-state, so that a current flows from the drain 212 of the semiconductor device 500 to the source 238D of the JFET 330. When the voltage "0" is applied to the input Vin of the inverter 550, the output Vout of the inverter 550 outputs the voltage "1", the gate 222 and the source 210 of the semiconductor device 500 and the gate 236C of the JFET 330 are all voltage inputs of "1". Therefore, at this time, the semiconductor device 500 is in an off-state and the JFET 330 is also in a non-conductive state. At this time, no current flows between the semiconductor device 500 and the JFET 330. As illustrated in FIGS. 2A and 2B, in some embodiments of the present disclosure, the semiconductor device 500 may be used as an E-mode HEMT by the electrical connection way of the inverter 550, the semiconductor device 500 and the JFET 330 of the semiconductor structure 600A. Since the gate 222 (the second gate 220 of the gate structure 222) of the semiconductor device 500 is electrically coupled to the source 210, when a bias is applied to the gate 222, the same bias is also applied to the source 210. The above-described bias applied to the source 210 may cause leakage to the substrate 200. In this embodiment, for example, based on the aforementioned drain coupling ratio ($\alpha_D$), source coupling ratio ($\alpha_S$), voltage ($V_B$) applied to the substrate 200, CG coupling ratio ($\alpha_{CG}$) and threshold voltage hypothesis value, when the bias applied to the source 210 is less than 5 V, the leakage to the substrate 200 can be neglected. When the N-type doped region 238C (drain) of the JFET 330 of the semiconductor structure 600A is electrically coupled to the source 210 of the semiconductor device 500, the JFET 330 may be used to pinch and block the current flowing to the source 210 of the semiconductor device 500. When the bias applied to the source 210 of the semiconductor device 500 is 0 V, the semiconductor device 500 is in a normally on state, and the JFET 330 is also in a normally on state. The current flowing to the source 210 of the semiconductor device 500 is conducted to the ground GND by the JFET 330, without affecting the device performance, and thereby reducing the leakage.

Figure 2C:
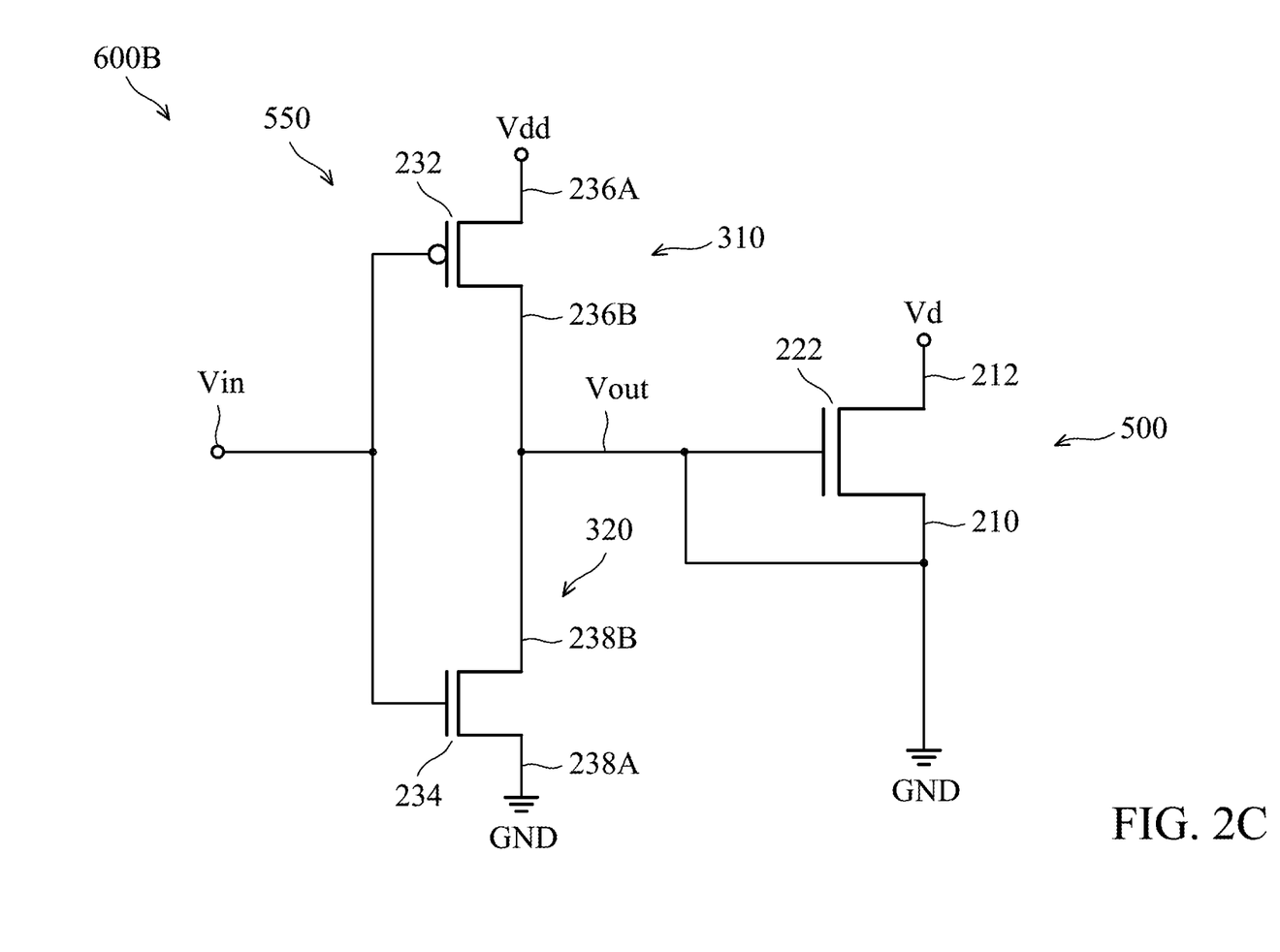
FIG. 2C shows an equivalent circuit diagram of a semiconductor device according to some embodiments of the present disclosure.

FIG. 2C shows an equivalent circuit diagram of the semiconductor structure 600B according to the embodiment of the present disclosure. The same or similar elements of the semiconductor structure 600B as the semiconductor structure 600A shown in FIG. 2B will not be repeated herein. The difference between the semiconductor structure 600B and the semiconductor structure 600A is that the semiconductor structure 600B does not include the JFET 330. Therefore, the source 210 of the semiconductor device 500 of the semiconductor structure 600B is directly electrically coupled to the ground GND. Compared to the semiconductor structure 600A, the circuit structure of the semiconductor structure 600B is relatively simple. If a bias is applied to the gate, the same bias will also be applied to the source. The circuit structure of the semiconductor structure 600B, for example, may be used when the leakage to the substrate 200 is negligible due to the bias applied to the source.

An embodiment of the present disclosure provides a semiconductor device and a semiconductor structure. The semiconductor device in the embodiment of the present disclosure is, for example, an enhancement-mode high electron mobility transistor (E-mode HEMT). The semiconductor device according to the embodiment of the present disclosure utilizes a gate stack, including a control gate and a floating gate, of a flash memory as a gate structure and electrically couples the gate structure and the source of the semiconductor device to each other, to enhance the threshold voltage of the HEMT as an E-mode transistor. In some embodiments of the present disclosure, the semiconductor structure may be formed by an inverter, a semiconductor device and a JFET. The semiconductor structure may couple the source of the semiconductor device to the drain of the JFET, and they are electrically coupled to the output of an inverter. By way of connection, the semiconductor device may be used as an E-mode HEMT, and the JFET may be used to pinch and block the current flowing to the source of the semiconductor device. Further, when the bias applied to the source of the semiconductor device is 0 V, the semiconductor device is in a normally on state and the JFET 330 is also in a normally on state. The current flowing to the source of the semiconductor device will be conducted to the ground by the JFET, without affecting device performance, and thereby reducing the leakage of the semiconductor device.

While the invention has been disclosed by several preferred embodiments, the invention is not limited to the embodiments. Those skilled in the art may make some substitutions and alterations herein without departing from the spirit and scope of the present invention, and the scope of protection of the present invention is defined as the subject matter set forth in the appended claims.

What is claimed is:

1. A semiconductor structure, comprising:
a substrate comprising a shallow trench isolation and a deep trench isolation, wherein a depth of the deep trench isolation is greater than a depth of the shallow trench isolation;
an inverter disposed on the substrate;
a junction field effect transistor disposed on the substrate;
a semiconductor device disposed on the substrate, wherein the semiconductor device comprises:
a first III-V compound layer disposed on the substrate;
a second III-V compound layer disposed on the first III-V compound layer;
a source and a drain disposed on opposite sidewall boundaries of the second III-V compound layer; and
a gate stack structure disposed on the second III-V compound layer, wherein the gate stack structure comprises:
a floating gate electrically floating and disposed on the second III-V compound layer;
a control gate disposed on and electrically isolated from the floating gate, wherein the control gate is electrically coupled to the source;
a first gate dielectric layer disposed between the floating gate and the second III-V compound layer; and
a second gate dielectric layer disposed between the floating gate and the control gate,
wherein a bottom surface of the floating gate is above a top surface of the second III-V compound layer, the first gate dielectric layer is isolated from the second gate dielectric layer by the floating gate, the shallow trench isolation is between the inverter and the junction field effect transistor, and the deep trench isolation is between the semiconductor device and the junction field effect transistor.

2. The semiconductor structure as claimed in claim 1, wherein the semiconductor device further comprises:
a buffer layer disposed between the substrate and the first III-V compound layer.

3. The semiconductor structure device as claimed in claim 1, wherein the semiconductor device further comprises:

a two dimensional electron gas thin layer formed on an interface between the first III-V compound layer and the second III-V compound layer.

4. The semiconductor structure as claimed in claim 1, wherein the first III-V compound layer includes GaN, the second III-V compound layer includes $Al_xGa_{1-x}N$, and $0<x\leq1$.

5. The semiconductor structure as claimed in claim 1, wherein the source and the drain are in contact with a top surface of the first III-V compound layer, respectively.

6. The semiconductor structure as claimed in claim 1, wherein the first gate dielectric layer and the second gate dielectric layer comprise hafnium oxide, hafnium silicate, hafnium silicon oxynitride, hafnium tantalum oxide, hafnium titanate, hafnium zirconium oxide, zirconium oxide, aluminum oxide, titanium oxide, hafnium oxide-aluminum oxide alloy, or combinations thereof.

7. The semiconductor structure as claimed in claim 1, wherein the floating gate is electrically insulated from the second III-V compound layer by the first gate dielectric layer and is electrically insulated from the control gate by the second gate dielectric layer.

8. A semiconductor structure, comprising:
an inverter disposed on a substrate, wherein the inverter has an input and an output;
a semiconductor device, comprising:
a first III-V compound layer disposed on the substrate;
a second III-V compound layer disposed on the first III-V compound layer;
a source and a drain disposed on opposite sidewall boundaries of the second III-V compound layer; and
a gate stack structure disposed on the second III-V compound layer, wherein the gate stack structure comprises:
a first gate disposed on the second III-V compound layer; and
a second gate disposed on and electrically isolated from the first gate, wherein the second gate is electrically coupled to the source and the output of the inverter; and
a junction field effect transistor,
wherein a gate and a drain of the junction field effect transistor are electrically coupled to a source of the semiconductor device, and
wherein a source of the junction field transistor is coupled to a ground.

9. The semiconductor structure as claimed in claim 8, wherein the inverter comprises:
a P-type metal oxide semiconductor field effect transistor (MOSFET), wherein:
a source of the P-type MOSFET is electrically coupled to a power driving voltage; and
an N-type metal oxide semiconductor field effect transistor (MOSFET), wherein:
a gate of the N-type MOSFET is electrically coupled to a gate of the P-type MOSFET and serves as the input of the inverter;
a drain of the N-type MOSFET is electrically coupled to a drain of the P-type MOSFET and serves as the output of the inverter; and
a source of the N-type MOSFET is electrically coupled to the ground.

10. The semiconductor structure as claimed in claim 8, wherein the drain of the semiconductor device is electrically coupled to a drain operating voltage.

11. The semiconductor structure as claimed in claim 10, wherein the semiconductor device is used as an enhancement-mode high electron mobility transistor.

12. The semiconductor structure as claimed in claim 8, wherein a conductive type of the substrate is P type, and the junction field effect transistor comprises:
a N-type well region disposed on the substrate;
a P-type doped region disposed on the N-type well region; and
a pair of N-type doped regions disposed on the N-type well region and on opposite sides of the P-type doped region.

13. The semiconductor structure as claimed in claim 12, wherein the P-type doped region is used as the gate of the junction field effect transistor.

14. The semiconductor structure as claimed in claim 12, wherein the pair of N-type doped regions are used as the source and the drain of the junction field effect transistor.

15. A semiconductor structure, comprising:
a substrate comprising a shallow trench isolation and a deep trench isolation, wherein a depth of the deep trench isolation is greater than a depth of the shallow trench isolation;
an inverter disposed on the substrate;
a junction field effect transistor disposed on the substrate;
a semiconductor device disposed on the substrate, wherein the semiconductor device comprises:
a first III-V compound layer disposed on the substrate;
a second III-V compound layer disposed on the first III-V compound layer;
a source and a drain disposed on opposite sidewall boundaries of the second III-V compound layer; and
a gate stack structure disposed on the second III-V compound layer, wherein the gate stack structure comprises:
a floating gate electrically floating and disposed on the second III-V compound layer;
a control gate disposed on and electrically isolated from the floating gate, wherein the control gate is electrically coupled to the source;
a first gate dielectric layer disposed between the floating gate and the second III-V compound layer; and
a second gate dielectric layer disposed between the floating gate and the control gate,
wherein a sidewall of the floating gate is aligns with a sidewall of the control gate, the first gate dielectric layer is isolated from the second gate dielectric layer by the floating gate, the shallow trench isolation is between the inverter and the junction field effect transistor, and the deep trench isolation is between the semiconductor device and the junction field effect transistor.

* * * * *